(12) United States Patent
Chu et al.

(10) Patent No.: US 11,874,537 B2
(45) Date of Patent: Jan. 16, 2024

(54) DISPLAY DEVICE

(71) Applicant: AU Optronics (Kunshan) Co., Ltd., Kunshan (CN)

(72) Inventors: Yung Chuan Chu, Kunshan (CN); Chao-Yun Cheng, Kunshan (CN); Shan-Fang Chen, Kunshan (CN); Haiyan Liu, Kunshan (CN)

(73) Assignee: AU OPTRONICS (KUNSHAN) CO., LTD., Kunshan (CN)

( * ) Notice: Subject to any disclaimer, the term of this patent is extended or adjusted under 35 U.S.C. 154(b) by 982 days.

(21) Appl. No.: 16/646,043

(22) PCT Filed: Dec. 28, 2018

(86) PCT No.: PCT/CN2018/125043
§ 371 (c)(1),
(2) Date: Mar. 10, 2020

(87) PCT Pub. No.: WO2020/133268
PCT Pub. Date: Jul. 2, 2020

(65) Prior Publication Data
US 2023/0244093 A1 Aug. 3, 2023

(51) Int. Cl.
*G06F 3/041* (2006.01)
*G02F 1/01* (2006.01)
(Continued)

(52) U.S. Cl.
CPC .......... *G02F 1/0102* (2013.01); *G06F 3/0412* (2013.01); *H01L 27/1218* (2013.01);
(Continued)

(58) Field of Classification Search
CPC .. G02F 1/0102; G02F 2202/22; G06F 3/0412; G06F 2203/04107; H01L 27/1218; H05K 9/0079
See application file for complete search history.

(56) References Cited

U.S. PATENT DOCUMENTS 9,759,966 B2    9/2017  Zhang et al.
2005/0142679 A1* 6/2005  Ahn ................... G02F 1/136286
                                                            438/30
(Continued)

FOREIGN PATENT DOCUMENTS

CN          2849767 Y    12/2006
CN        102981322 A     3/2013
(Continued)

*Primary Examiner* — Mustak Choudhury
(74) *Attorney, Agent, or Firm* — WPAT, P.C.

(57) ABSTRACT

The present invention relates to a display device, comprising: a first substrate comprising a first inner surface, a first outer surface opposite to the first inner surface, a display region, a bonding region adjacent to the display region, a plurality of thin film transistors disposed on the first inner surface and corresponding to the display region; a second substrate opposite to the display region and comprising a second inner surface, a second outer surface opposite to the second inner surface, a first color resist and a second color resist each disposed on the second inner surface; a display molecular layer disposed between the first substrate and the second substrate; an electrical shielding layer disposed on the first outer surface of the first substrate, wherein the electrical shielding layer comprises a first shielding region corresponding to the first color resist and a second shielding region corresponding to the bonding region.

20 Claims, 2 Drawing Sheets

(51) Int. Cl.
*H01L 27/12* (2006.01)
*H05K 9/00* (2006.01)

(52) U.S. Cl.
CPC ....... *H05K 9/0079* (2013.01); *G02F 2202/22* (2013.01); *G06F 2203/04107* (2013.01)

(56) References Cited

U.S. PATENT DOCUMENTS

| | | | | |
|---|---|---|---|---|
| 2010/0165280 | A1* | 7/2010 | Ishitani | G06F 3/045 |
| | | | | 349/141 |
| 2016/0342046 | A1* | 11/2016 | Wu | H01L 27/1259 |
| 2017/0045995 | A1 | 2/2017 | Zhao et al. | |
| 2019/0113817 | A1* | 4/2019 | Wang | H01L 27/1214 |
| 2019/0304925 | A1 | 10/2019 | Zhao et al. | |

FOREIGN PATENT DOCUMENTS

| | | | | |
|---|---|---|---|---|
| CN | 104407761 A | | 3/2015 | |
| KR | 101749710 B1 * | | 7/2017 | ............. G06F 3/045 |

* cited by examiner

DISPLAY DEVICE

TECHNICAL FIELD

The disclosure relates to a display device, and particularly to a display device having an electrostatic protection structure.

BACKGROUND ART

With development of the technology of the display device, a resolution of the display device becomes higher, such that the metal wires of the thin film transistor array of the display device becomes thinner and denser, and the available region for the circuit becomes smaller. Therefore, it is necessary to simplify the Electro-Static Discharge (ESD) protection circuit, which reduces the capability of electrostatic protection for the thin film transistor array. When the static electricity is accumulated on a surface of the substrate, the static electricity cannot be easily dissipated, and when the static electricity is discharged, the circuit may be easily damaged by the electrostatic breakdown.

Currently, due to the product with touch function, the resistance of the high impedance electrostatic film on the color resist layer is limited to be between $5\times10^8\Omega$ and $9\times10^9\Omega$, because the static electricity may be easily accumulated when the resistance is large.

In addition, because the capability of electrostatic protection is reduced, a large amount of static electricity may be generated during the manual processes and the attaching processes performed after the combination of panels, such that the circuit is damaged by the electrostatic breakdown.

DISCLOSURE OF THE PRESENT INVENTION

With respect to the above problem, the present invention provides a display device having an electrical shielding layer for improving a capability of electrostatic dissipation to prevent a circuit element from being damaged by a discharge of static electricity that may be caused by an accumulation of static electricity.

Specifically, one embodiment of the present invention provides a display device, comprising: a first substrate, comprising a first inner surface, a first outer surface opposite to the first inner surface, a display region, a bonding region adjacent to the display region, and a plurality of thin film transistors disposed on the first inner surface and corresponding to the display region; a second substrate, opposite to the display region and comprising a second inner surface, a second outer surface opposite to the second inner surface, a first color resist and a second color resist each disposed on the second inner surface; a display molecular layer, disposed between the first substrate and the second substrate; and an electrical shielding layer, disposed on the first outer surface, wherein the electrical shielding layer comprises a first shielding region corresponding to the first color resist and a second shielding region corresponding to the bonding region.

In the display device according to the embodiment of the present invention, a thickness of the first color resist is larger than a thickness of the second color resist.

In the display device according to the embodiment of the present invention, a projection area of the first shielding region overlaps a projection area of the first color resist in the vertical projection of the first substrate.

In the display device according to the embodiment of the present invention, the first color resist has a protrusion overlapping with a projection area of the first color resist in the vertical projection of the first substrate.

In the display device according to the embodiment of the present invention, the first shielding region is connected to the second shielding region.

In the display device according to the embodiment of the present invention, a color of the first color resist is different from a color of the second color resist.

The display device according to the embodiment of the present invention further comprises: a high resistance electrostatic preventing layer, disposed on the second outer surface; a first touch metal layer, disposed on the first inner surface; and a second touch metal layer, disposed on the second inner surface.

In the display device according to the embodiment of the present invention, a resistance of the high resistance electrostatic preventing layer is larger than a resistance of the electrical shielding layer.

In the display device according to the embodiment of the present invention, the resistance of the electrical shielding layer is equal to or smaller than $1000\Omega$. In the display device according to the embodiment of the present invention, the electrical shielding layer is made of a transparent conductive material comprising ITO, IZO and an organic conductive material.

The display device according to the embodiment of the present invention further comprises: a first polarizer, disposed on the first outer surface with the electrical shielding layer positioned between the first polarizer and the first substrate; and a second polarizer, disposed on the second outer surface with the high resistance electrostatic preventing layer positioned between the second polarizer and the second substrate.

In the display device according to the embodiment of the present invention, the first shielding region is formed as a single strip or a plurality of strips.

Another embodiment of the present invention provides a display device, comprising: a first substrate, comprising a first inner surface, a first outer surface opposite to the first inner surface, a display region, a bonding region adjacent to the display region; a second substrate, opposite to the display region; a display molecular layer, disposed between the first substrate and the second substrate; a plurality of thin film transistors, disposed on the first inner surface and corresponding to the display region; and an electrical shielding layer, disposed on the first outer surface, wherein the electrical shielding layer comprises a first shielding region, formed as a single strip or a plurality of strips and corresponding to the display region, and a second shielding region corresponding to the bonding region.

In the display device according to the embodiment of the present invention, the first shielding region is connected to the second shielding region.

The display device according to the embodiment of the present invention further comprises: a high resistance electrostatic preventing layer, disposed on the second outer surface; a first touch metal layer, disposed on the first inner surface; and a second touch metal layer, disposed on the second inner surface.

In the display device according to the embodiment of the present invention, a resistance of the high resistance electrostatic preventing layer is larger than a resistance of the electrical shielding layer.

In the display device according to the embodiment of the present invention, the resistance of the electrical shielding layer is equal to or smaller than $1000\Omega$.

In the display device according to the embodiment of the present invention, the electrical shielding layer is made of a transparent conductive material comprising ITO, IZO and an organic conductive material.

The display device according to the embodiment of the present invention further comprises: a first polarizer disposed on the first outer surface with the electrical shielding layer positioned between the first polarizer and the first substrate; and a second polarizer disposed on the second outer surface with the high resistance electrostatic preventing layer positioned between the second polarizer and the second substrate.

IN THE DRAWINGS, THE REFERENCE SIGNS ARE

Figure 1:
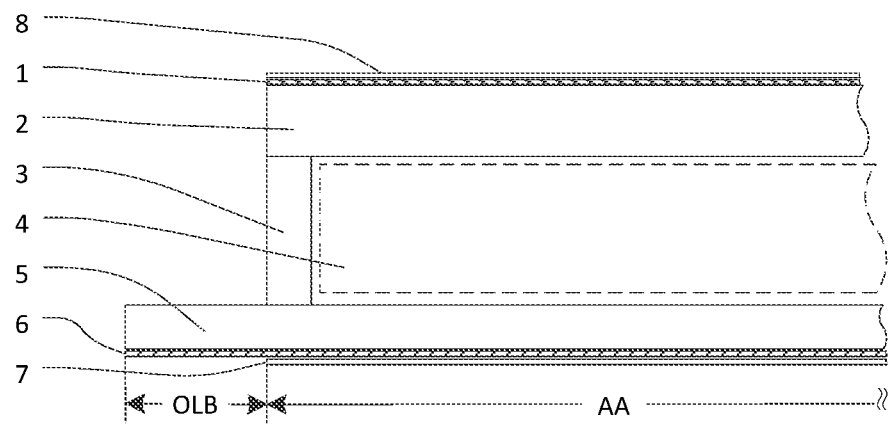
FIG. 1 is a partial sectional view of a display device according to a first embodiment of the present invention.

1: high resistance electrostatic preventing layer
2: second substrate
3: plastic frame
4: display molecular layer
5: first substrate
6: electrical shielding layer
7: first polarizer
8: second polarizer
21: first color resist
22: second color resist
211: protrusion of color resist
61: electrical shielding layer of bonding region
62: electrical shielding layer of display region
63: connection line of electrical shielding layer
OLB: bonding region
AA: display region
A-A': sectional view

DETAILED DESCRIPTION OF THE EXEMPLARY EMBODIMENTS

Hereinafter, the embodiments of the present invention are disclosed with reference to the accompanying drawings, and many details will be explained in the following context for the sake of clarity. However, it shall be understood that these details are not intended to limit the present invention. In other words, in certain embodiment of the present invention, these details are unnecessary. In addition, some of the structures and elements that are well known will be simply illustrated for the purpose of simplifying the accompanying drawings.

In the drawings, thicknesses of a layer, a film, a panel, and a region are exaggerated for clarity. In the whole specification, the same reference numeral represents the same element. It shall be understood that when an element such as a layer, a film, a region or a substrate is referred to as being "on" or "connected to" another element, it may be directly on or connected to another element, or an intervening elements may be present. In contrast, when an element is referred to as being "directly on" or "directly connected to" another element, there is no intervening element. As used herein, "connection" may refer to physical and/or electrical connection. However, "electrical connection" means that other elements may be present between two elements.

It shall be understood that, although the terms "first", "second", etc. may be used herein to describe various elements, components, regions, layers and/or sections, these elements, components, regions, layers and/or sections shall not be limited by these terms. These terms are only used to distinguish one element, component, region, layer or section from another element, component, region, layer or section. Therefore, "first element", "first component", "first region", "first layer" or "first section" discussed below may be referred to as "second element", "second component", "second region", "second layer" or "second section" without departing from the teaching of the present invention.

The terminology used herein is only intended to explain the particular embodiment without limiting the present invention. As used herein, the singular forms "a," "an" and "the" may include the plural forms including "at least one", unless the context clearly indicates otherwise. "Or" represents "and/or". As used herein, the term "and/or" includes any and all combinations of one or more of the associated listed items. It shall be understood that the terms "comprise" and/or "comprising" when used in this specification, specify the presence of the feature, region, entirety, step, operation, element, and/or component, but do not preclude the presence or addition of one or more other feature, entire region, step, operations, element, component, and/or combination thereof.

In addition, relative term such as "under" or "bottom", and "on" or "top", may be used herein to describe the relationship between one element and another element as illustrated in the drawing. It shall be understood that the relative terms are intended to encompass different orientation of the device in addition to the orientation illustrated in the drawing. For example, if the device in one drawing is turned over, an element described as "under" other element is oriented "on" the other elements. Therefore, the exemplary term "under" can encompass an orientation of "under" and "on" depending on the particular orientation of the drawing. Similarly, if the device in the drawing is turned over, an element described as "under" or "below" other element is oriented "above" the other element. Therefore, the exemplary term "under" or "below" can encompass an orientation of above and below.

FIG. 1 is a partial sectional view of a display device according to a first embodiment of the present invention. As shown in FIG. 1, a display device is provided in the first embodiment of the present invention, which comprises: a first substrate 5, a second substrate 2, a display molecular layer 4, a first polarizer 7 and a second polarizer 8. The first substrate 5 comprises a display region AA and a bonding region OLB adjacent to each other. In this embodiment, the first substrate 5 is an active array substrate, and the second substrate 2 is a color filter substrate. The first substrate 5 and the second substrate 2 are disposed to be opposite to each other, and the second substrate 2 is disposed as corresponding to the display region AA of the first substrate 5. The first polarizer 7 is disposed on an outer surface of the first substrate 5 (one side of the first substrate 5 not facing the second substrate 2), and the second polarizer 8 is disposed on an outer surface of the second substrate 2 (one side of the second substrate 2 not facing the first substrate 5). A plurality of thin film transistors are disposed in the display region AA of an inner surface of the first substrate 5 (one side of the first substrate 5 facing the second substrate 2). In order to drive and control the thin film transistors, the thin film transistors are electrically connected to a gate driver by gate lines, and electrically connected a data driver by data lines. A plurality of color resists are disposed on an inner surface of the second substrate 2 (one side of the second substrate 2 facing the first substrate 5). For sake of clarity, the thin film transistors and the color resists are not shown in FIG. 1. The display molecular layer 4 is disposed in a space sealed by a plastic frame 3 between the first substrate 5 and the second substrate 2. The display device according to the first embodiment of the present invention is a touch display device having a touch structure, comprising a high resistance electrostatic preventing layer 1, a touch metal layer and a touch circuit. For sake of clarity of the disclosure, the touch metal layer and the touch circuit are not shown in FIG. 1. The high resistance electrostatic preventing layer 1 is disposed on the outer surface of the second substrate 2 and between the second polarizer 8 and the second substrate 2, the touch metal layer is disposed on the inner surface or the outer surface of the second substrate 2, and disposed on the inner surface or the outer surface of the first substrate 5, and the touch circuits is generally disposed on the first substrate 5. However, the touch metal layer and the touch circuit may be disposed on other positions of the display device to complete the touch operation, and the present invention is not limited thereto.

The display device according to the first embodiment of the present invention further comprises an electrical shielding layer 6 coated on the outer surface of the first substrate 5 and between the first polarizer 7 and the first substrate 5. As compared to the high resistance electrostatic preventing layer 1 having a high resistance (between $5 \times 10^8 \Omega$ and $9 \times 10^9 \Omega$), the electrical shielding layer 6 has a relatively low resistance, for example, less than or equal to $1000\Omega$, and is grounded through electrical connection with other component of the display device. The electrical shielding layer 6 may be made of a transparent conductive material such as ITO, IZO or an organic conductive material, but the present invention is not limited thereto. The electrical shielding layer 10 may be coated on the entire outer surface of the first substrate 5 according to the requirement for electrostatic dissipation, and the electrical shielding layer 6 may be coated by sputtering to have regular patterns, for example, regular patterns along driving lines, or regular patterns on certain regions where accumulation of static electricity may occur to form a plurality of electrical shielding regions having strip shape or corresponding shape, according to the requirement for optics, brightness and transmissivity of the display device, but the present invention is not limited thereto. In this embodiment, the high resistance electrostatic preventing layer 1 may prevent the static electricity generated by touch. Specifically, when the finger contacts or moves onto the outer surface of the second substrate 2, the static electricity may be accumulated to affect the touch sensing, so the high resistance electrostatic preventing layer 1 is used to reduce the static electricity and improve the touch sensing. The electrical shielding layer 6 is adapted to reduce the static electricity accumulated during the manufacturing process. For example, when the machine equipment, worker or environment contacts the display device during the manufacturing process, the static electricity may be transferred to or remained on a surface of the display device. Particular, when the worker holds the display device with hand, the static electricity may be easily transferred to a lower surface of the first substrate 5 of the display device. Therefore, the electrical shielding layer 6 may be used to prevent the accumulation of static electricity, and facilitate the dissipation or elimination of static electricity, thereby improving a yield of display device.

Figure 2:
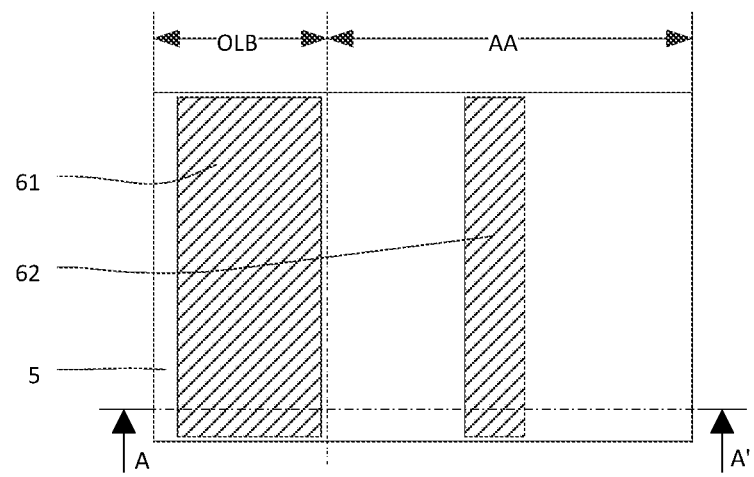
FIG. 2 is a partial top view of a display device according to a second embodiment of the present invention.
Figure 3:
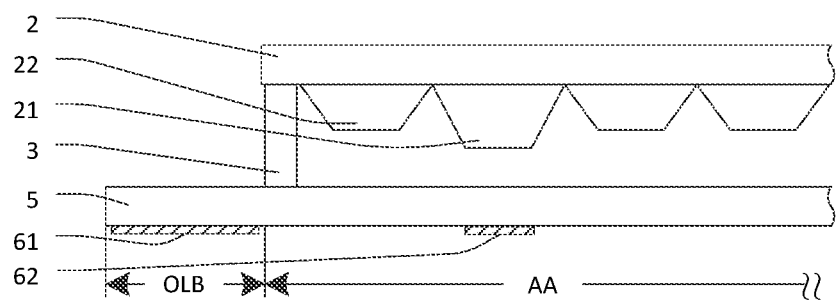
FIG. 3 is a partial sectional view taken along line A-A' of the display device according to the second embodiment of the present invention.

FIG. 2 is a partial top view of a display device according to a second embodiment of the present invention, and FIG. 3 is a partial sectional view taken along line A-A' of the display device according to the second embodiment of the present invention. As shown in FIG. 3 which corresponds to FIG. 2, in the second embodiment of the present invention, the color resist of the second substrate 2 is divided into a first color resist 21 and a second color resist 22 having different colors, and a thickness of the first color resist 21 is slightly larger than a thickness of the second color resist 22 due to the material and/or process. Specifically, in the process for producing the color resist, a partial region of the display region AA may be repeatedly irradiated by light due to the configuration of the lighting instrument, such that a thickness of the color resist in the corresponding region is relatively large. In the embodiment as shown in FIG. 3, the thickness of the first color resist 21 is larger than that of other color resist (e.g., the second color resist 22). For example, the first color resist 21 may be a blue color resist and the second color resist 22 may be a red color resist and a green color resist to form a periodical arrangement of the blue color resist, the red color resist and the green color resist, and the thickness of the blue color resist is larger than that of the red color resist or the green color resist, but the present invention is not limited thereto. The first color resist 21 may be the blue color resist and the second color resist 22 may be the red color resist, the green color resist and the blue color resist to form a periodical arrangement of the blue color resist, the red color resist and the green color resist, and the thickness of a part of blue color resists (e.g., the first color resist 21) is larger than that of another part of the blue color resists (e.g., the second color resist 22), the red color resist or the green color resist. However, the present invention is not limited thereto, and the color resists having different colors may be variously combined and arranged depending on different requirements for display quality. The purpose of the embodiment as shown in FIG. 2 is to express that the thickness of a part of color resists (e.g., the first color resist 21) is larger than that of other color resist (e.g., the second color resist 22) due to the influence of the process. For sake of clarity of the disclosure of the present invention, the high resistance electrostatic preventing layer, the display molecular layer, the first polarizer and the second polarizer are not shown in FIG. 3.

Referring to both of FIGS. 2 and 3, in this embodiment, a projection area of the electrical shielding layer of display region 62 overlaps a projection area of the first color resist 21 in the vertical projection of the first substrate 5. Specifically, the electrical shielding layer is divided into an electrical shielding layer of bonding region 61 and an electrical shielding layer of display region 62 according to the coating regions, the electrical shielding layer of bonding region 61 is coated on the entire bonding region OLB, and the electrical shielding layer of display region 62 is only coated on a region corresponding to the first color resist 21. When the thicknesses of the color resists are not uniform, such that the thickness of the first color resist 21 is larger than that of other color resist, as shown in FIG. 3, an image defect (such as, lens mura) may be generated in the display device during display. Therefore, the electrical shielding layer 6 is disposed as corresponding to the first color resist 21 to reduce the image defects by shielding the backlight brightness of this region through the optical characteristics of the electrical shielding layer 6. In such way, the electrical shielding layer 6 can not only reduce the static electricity generated during the process, but also lower the failure rate due to the image defect, thereby improving the process yield and the image quality.

In a general case (i.e., under the influence of the above process apparatus), the first color resist 21 is formed to have a strip shape on the second substrate 2, such that the image defect (such as, lens mura) may have a strip shape. Therefore, the electrical shielding layer of display region 62 corresponding to the first color resist 21 is formed to have a strip shape, but the present invention is not limited thereto. When the first color resist 21 has other shape or a strip shape in other direction, such as, a strip shape extending in a horizontal direction, the electrical shielding layer of display region 62 corresponding to the first color resist 21 is formed to have a corresponding shape or a strip shape in the corresponding direction. Alternatively, when there are a plurality of first color resists 21, the electrical shielding layer of display region 62 corresponding to the first color resists 21 are formed as a plurality of strips to cover a region of the first color resists 21 projected onto the first substrate 5.

Figure 4:
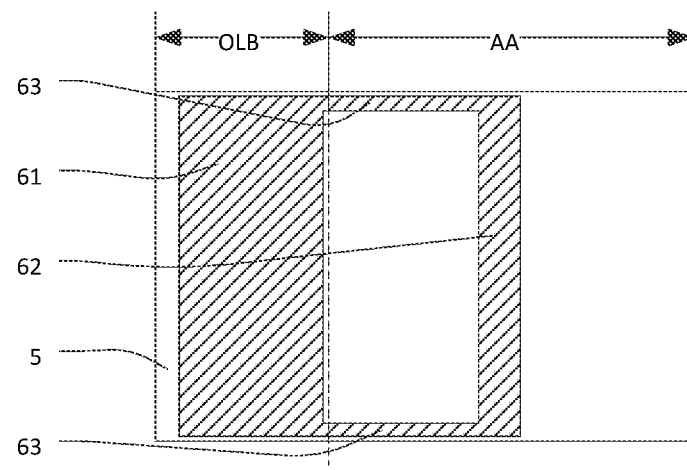
FIG. 4 is a partial top view of a display device according to a third embodiment of the present invention.

FIG. 4 is a partial top view of a display device according to a third embodiment of the present invention. As shown in FIG. 4, the third embodiment of the present invention differs from the embodiment of FIG. 2 in that the electrical shielding layer of bonding region 61 is electrically connected to the electrical shielding layer of display region 62 by a connection line of electrical shielding layer 63 to further improve the efficiency of electrostatic dissipation. That is, a shielding area of the electrical shielding layer of display region 62 is enlarged and a capability of electrostatic dissipation of the electrical shielding layer is improved without increasing a coating area of the electrical shielding layer of display region 62.

Figure 5:
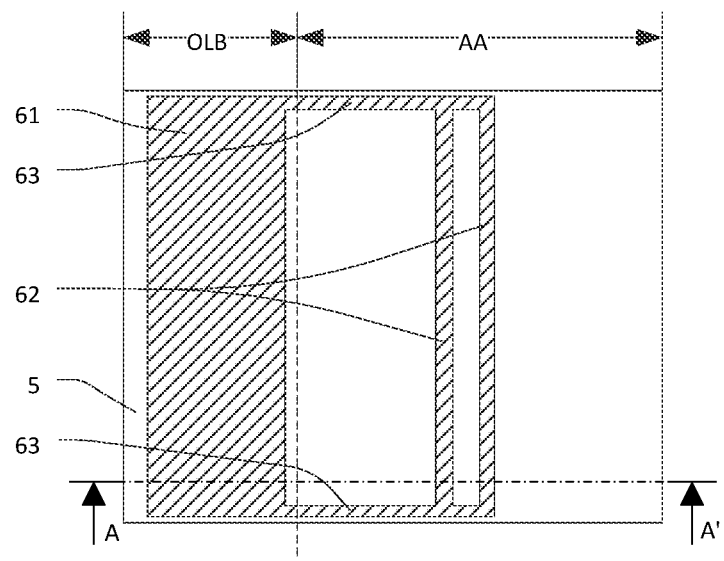
FIG. 5 is a partial top view of a display device according to a fourth embodiment of the present invention.
Figure 6:
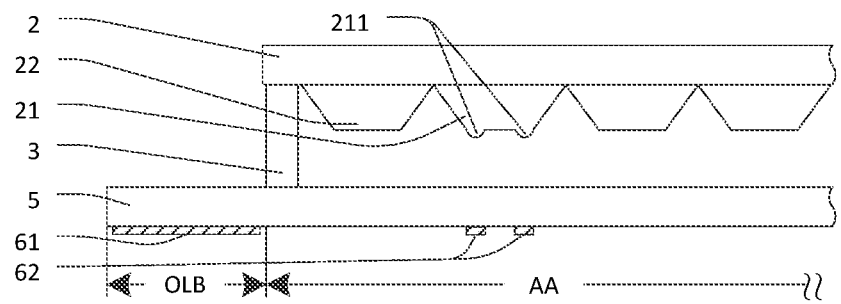
FIG. 6 is a partial sectional view taken along line A-A' of the display device according to the fourth embodiment of the present invention.

FIG. 5 is a partial top view of a display device according to a fourth embodiment of the present invention, and FIG. 6 is a partial sectional view taken along line A-A' of the display device according to the fourth embodiment of the present invention. As shown in FIG. 6 which corresponds to FIG. 5, in the fourth embodiment of the present invention, the color resist of the second substrate 2 is divided into a first color resist 21 and a second color resist 22 having different colors. This embodiment differs from the embodiment of FIG. 3 mainly in that a part of the color resist has color resist protrusions like horns, such as, the color resist protrusions 211 on the first color resist 21, due to the material and/or process. For example, the first color resist 21 may be a blue color resist, and the second color resist 22 may be a red color resist and a green color resist, or the second color resist 22 may be the red color resist, the green color resist and the blue color resist, which are same as those in the second embodiment, so the details are not described here. For the sake of clarity of the disclosure of the present invention, the high resistance electrostatic preventing layer, the display molecular layer, the first polarizer and the second polarizer are not shown in FIG. 6.

Referring to both of FIGS. 5 and 6, in this embodiment, a projection area of the electrical shielding layer of display region 62 overlaps a projection area of the color resist protrusion 211 of the first color resist 21 in the vertical projection of the first substrate 5, such that the image defects are reduced by shielding the backlight brightness of this region through the optical characteristics of the electrical shielding layer 6. In such way, the electrical shielding layer 6 can not only reduce the static electricity generated during the process, but also lower the failure rate due to the image defect, thereby improving the process yield and the image quality.

In this embodiment, the electrical shielding layer of bonding region 61 and the electrical shielding layer of display region 62 may be disconnected with each other (as shown in FIG. 2), or may be electrically connected with each other by the connection line of electrical shielding layer 63 (as shown in FIG. 5) to enlarge the shielding area of the electrical shielding layer of display region 62 and improve the capability of electrostatic dissipation of the electrical shielding layer without increasing the coating area of the electrical shielding layer of display region 62.

Although the present invention has been disclosed in the above embodiments, the present invention is not limited thereto. Any ordinary person having skills of the art may make various modifications and improvements without departing from spirit and range of the present invention, so the extent of protection of the present invention shall be determined by the range of the appended claims.

INDUSTRIAL APPLICABILITY

In a display device of the present invention, an electrical shielding layer is disposed on the TFT substrate to dissipate the accumulated static electricity of the display device and prevent an element from being damaged by a discharge of the static electricity, thereby improving the yield of the display device. Meanwhile, the non-uniform backlight caused by the color resists having non-uniform thickness is shield by using the optical characteristics of the electrical shielding layer, such that the image defects of the display device are remedied to improve the yield of process and the image quality.

The invention claimed is:

1. A display device, comprising: a first substrate, comprising a first inner surface, a first outer surface opposite to the first inner surface, a display region, a bonding region adjacent to the display region, and a plurality of thin film transistors disposed on the first inner surface and corresponding to the display region; a second substrate, opposite to the display region and comprising a second inner surface, a second outer surface opposite to the second inner surface, a first color resist and a second color resist each disposed on the second inner surface; a display molecular layer, disposed between the first substrate and the second substrate; and an electrical shielding layer, disposed on the first outer surface, wherein the electrical shielding layer comprises a first shielding region corresponding to the first color resist and a second shielding region corresponding to the bonding region; and a first polarizer disposed on the first outer surface, with the electrical shielding layer positioned between the first polarizer and the first substrate.

2. The display device according to claim 1, wherein a thickness of the first color resist is larger than a thickness of the second color resist.

3. The display device according to claim 2, wherein a projection area of the first shielding region overlaps a projection area of the first color resist in the vertical projection of the first substrate.

4. The display device according to claim 3, wherein the first shielding region is connected to the second shielding region.

5. The display device according to claim 2, wherein a color of the first color resist is different from a color of the second color resist.

6. The display device according to claim 1, wherein the first color resist has a protrusion overlapping with a projection area of the first color resist in the vertical projection of the first substrate.

7. The display device according to claim 6, wherein the first shielding region is connected to the second shielding region.

8. The display device according to claim 1, further comprising:
  a high resistance electrostatic preventing layer, disposed on the second outer surface;
  a first touch metal layer, disposed on the first inner surface; and
  a second touch metal layer, disposed on the second inner surface.

9. The display device according to claim 8, wherein a resistance of the high resistance electrostatic preventing layer is larger than a resistance of the electrical shielding layer.

10. The display device according to claim 9, wherein the resistance of the electrical shielding layer is equal to or smaller than $1000\Omega$.

11. The display device according to claim 8, further comprising: a second polarizer disposed on the second outer surface, with the high resistance electrostatic preventing layer positioned between the second polarizer and the second substrate.

12. The display device according to claim 1, wherein the electrical shielding layer is made of a transparent conductive material comprising ITO, IZO and an organic conductive material.

13. The display device according to claim 1, wherein the first shielding region is formed as a single strip or a plurality of strips.

14. A display device, comprising: a first substrate, comprising a first inner surface, a first outer surface opposite to the first inner surface, a display region and a bonding region adjacent to the display region; a second substrate, opposite to the display region; a display molecular layer, disposed between the first substrate and the second substrate; a plurality of thin film transistors, disposed on the first inner surface and corresponding to the display region; and an electrical shielding layer, disposed on the first outer surface, wherein the electrical shielding layer comprises: a first shielding region, formed as a single strip or a plurality of strips and corresponding to the display region, a second shielding region corresponding to the bonding region; and a first polarizer disposed on the first outer surface, with the electrical shielding layer positioned between the first polarizer and the first substrate.

15. The display device according to claim 14, wherein the first shielding region is connected to the second shielding region.

16. The display device according to claim 14, further comprising:
  a high resistance electrostatic preventing layer, disposed on the second outer surface;
  a first touch metal layer, disposed on the first inner surface; and
  a second touch metal layer, disposed on the second inner surface.

17. The display device according to claim 16, wherein a resistance of the high resistance electrostatic preventing layer is larger than a resistance of the electrical shielding layer.

18. The display device according to claim 17, wherein the resistance of the electrical shielding layer is equal to or smaller than $1000\Omega$.

19. The display device according to claim 16, further comprising: a second polarizer disposed on the second outer surface, with the high resistance electrostatic preventing layer positioned between the second polarizer and the second substrate.

20. The display device according to claim 14, wherein the electrical shielding layer is made of a transparent conductive material comprising ITO, IZO and an organic conductive material.

* * * * *